US008164500B2

(12) United States Patent
Ahmed et al.

(10) Patent No.: US 8,164,500 B2

(45) Date of Patent: Apr. 24, 2012

(54) JITTER CANCELLATION METHOD FOR CONTINUOUS-TIME SIGMA-DELTA MODULATORS

(75) Inventors: Ramy Ahmed, College Station, TX (US); Sebastian Hoyos, College Station, TX (US); José Silva-Martinez, College Station, TX (US)

(73) Assignee: University, Texas A&M, College Station, TX (US)

( * ) Notice: Subject to any disclaimer, the term of this patent is extended or adjusted under 35 U.S.C. 154(b) by 48 days.

(21) Appl. No.: 12/885,605

(22) Filed: Sep. 20, 2010

(65) Prior Publication Data

US 2012/0068868 A1 Mar. 22, 2012

(51) Int. Cl.
*H03M 3/02* (2006.01)

(52) U.S. Cl. ........................................................ 341/143

(58) Field of Classification Search ................... 341/143
See application file for complete search history.

(56) References Cited

U.S. PATENT DOCUMENTS

| | | | | |
|---|---|---|---|---|
| 7,791,518 B2 * | 9/2010 | Balachandran | ............... | 341/144 |
| 2002/0140590 A1 * | 10/2002 | Eshraghi et al. | .............. | 341/143 |
| 2007/0057830 A1 * | 3/2007 | Wiesbauer et al. | ........... | 341/126 |
| 2009/0140898 A1 * | 6/2009 | Ceballos | ....................... | 341/143 |
| 2010/0225517 A1 * | 9/2010 | Aiba | ............................. | 341/143 |

OTHER PUBLICATIONS

Cherry et al., Excess Loop Delay in Continuous-Time Delta-Sigma Modulators, IEEE transactions on Circuits and Systems-II: Analog and Digital Signal Processing, vol. 46, No. 4, Apr. 1999, pp. 376-389.*

Anderson, M. et al. Design and Measurement of a CT Delta-Sigma ADC with Switched-Capacitor Switched Resistor Feedback, IEEE Journal of Solid-State Circuits, Feb. 2009, vol. 44, No. 2, pp. 473-483.*

Chang, H. et al., A Simple Technique to Reduce Clock Jitter Effects in Continuous-Time Delta-Sigma Modulators, IEEE International Symposium on Circuits and Systems 2008. ISCAS 2008, May 2008 pp. 1870-1873.*

Zare-Hoseini, H. et al., Continuous Time Delta Sigma modulators withReduced Clock Jitter Sensitivity, Proceedings 2006 IEEE International Symposium on Circuits and Systems, May 2006, pp. 5371-5374.*

* cited by examiner

*Primary Examiner* — Howard Williams

(74) *Attorney, Agent, or Firm* — Antony P. Ng; Yudell Isidore Ng Russell PLLC

(57) ABSTRACT

A continuous-time delta-sigma analog-to-digital converter (ADC) is disclosed. The ADC includes a loop filter, a loop quantizer, and a clock-jitter tolerant digital-to-analog converter (DAC). The clock-jitter tolerant DAC includes a dual switched-current (SI) DAC, a switched-capacitor (SC) DAC, an adder, and a switched-capacitor-resistor (SCR) injection circuit. The dual SI DAC provides two identical analog signals from the feedback digital signal of a loop quantizer within the ADC. The SC DAC provides an error-free reference signal from the feedback digital signal. The adder subtracts one of the two analog signals from the error-free reference signal to obtain an inverted jitter-induced error signal. The SCR injection circuit then injects the inverted jitter-induced error signal, delayed by one clock-cycle, in the form of a half-delay return-to-zero exponentially decaying waveform into the loop filter.

9 Claims, 3 Drawing Sheets

JITTER CANCELLATION METHOD FOR CONTINUOUS-TIME SIGMA-DELTA MODULATORS

BACKGROUND OF THE INVENTION

1. Technical Field

The present invention relates to analog-to-digital converters in general, and in particular to a continuous-time delta-sigma analog-to-digital converter featuring clock-jitter error shaping in a feedback digital-to-analog converter.

2. Description of Related Art

Continuous-time delta-sigma analog-to-digital converters (ADCs) have gained significant attention in the field of wideband receivers because of their ability to operate at high speeds with lower power consumptions when compared to their discrete-time counterparts. However, continuous-time delta-sigma ADCs suffer from critical limitations due to their high sensitivity to pulse-width jitter in feedback digital-to-analog converter (DAC) waveforms.

The above mentioned pulse-width jitter problem arises from the random variations of DAC sampling clock edges that cause uncertainty in the integrated values at the outputs of loop filter integrators. This problem is equivalent to the application of a random phase modulation to the digital signal coming in a feedback path, which causes a part of the shaped noise, outside the signal band, to fall into the band of interest. The pulse-width jitter in the DAC feeding the first stage of the loop filter of a continuous-time delta-sigma ADC is very harmful because its resulting error appears directly at the output of the ADC without any shaping or suppression.

Consequently, it would be desirable to provide an improved continuous-time delta-sigma ADC capable of handling pulse-width jitter problems.

SUMMARY OF THE INVENTION

In accordance with a preferred embodiment of the present invention, a continuous-time delta-sigma analog-to-digital converter (ADC) includes a loop filter, a loop quantizer, and a clock-jitter tolerant digital-to-analog converter (DAC). The clock-jitter tolerant DAC includes a dual switched-current (SI) DAC, a switched-capacitor (SC) DAC, an adder, and a switched-capacitor-resistor (SCR) injection circuit. The dual SI DAC provides first and second identical analog signals from the feedback digital signal of the loop quantizer within the ADC. The SC DAC provides an error-free reference signal from the feedback digital signal of the loop quantizer within the ADC. The first analog signal of the dual SI DAC provides the main feedback signal to the loop filter. The adder subtracts the second analog signal of the dual SI DAC from the error-free reference signal in order to obtain an inverted jitter induced error signal. The SCR injection circuit then injects the resulting inverted jitter induced error signal, delayed by one clock-cycle, in the form of a half-delay return-to-zero exponentially decaying waveform into the loop filter. As a result, a first-order spectral shaping for the jitter induced error is achieved by combining the hybrid signals coming from the first analog signal of the dual SI DAC and the exponentially-decaying waveform coming from the SCR injection circuit at the input of the loop filter.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

I. Introduction

Rectangular waveform digital-to-analog converters (DACs) are commonly used in continuous-time delta-sigma modulators due to their simplistic implementation and the relatively relaxed slew rate requirement they offer for loop filter integrators. However, return-to-zero (RZ) DACs are most sensitive to feedback pulse-width jitter because the random variations affect the rising and falling edges of a DAC waveform at every clock cycle. The jitter sensitivity can be slightly reduced by using a non-return-to-zero (NRZ) DAC because pulse-width jitter will be effective only during the clock edges at which a data value is changing. Nevertheless, for a typical wideband continuous-time delta-sigma modulator having a NRZ switched-current (SI) DAC in the feedback path, the error induced by the pulse-width jitter in the DAC waveform can still be as high as 30% to 40% of the noise budget.

Figure 1A:
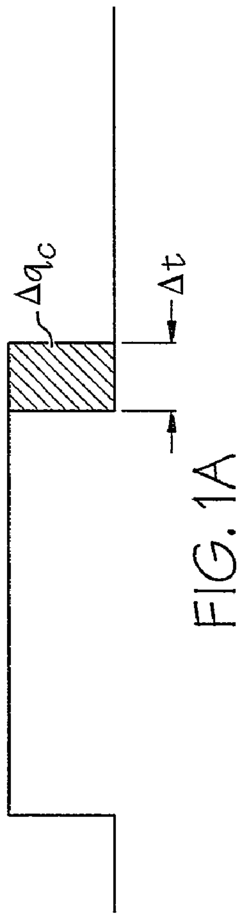
FIGS. 1*a*-1*b* depict jitter induced integrated charge errors in continuous-time delta-sigma ADCs.
Figure 1B:
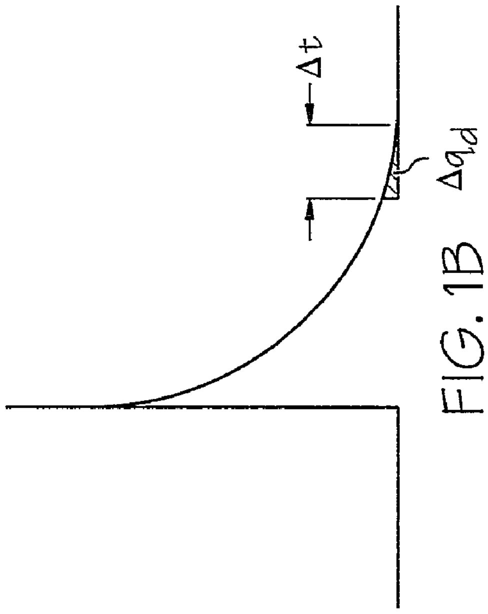

One common solution for alleviating the pulse-width jitter induced error in a DAC is to use a switched-capacitor-resistor (SCR) DAC that provides an exponentially decaying waveform. Referring now to the drawings, and in particular to FIGS. 1*a*-1*b*, there are depicted the high tolerance to pulse-width jitter offered by a half-delay return-to-zero (HRZ) exponentially decaying waveform over a rectangular NRZ waveform. In the rectangular waveform shown in FIG. 1*a*, the change in the amount of charge $\Delta q_c$ caused by pulse-width jitter varies linearly with variation in time $\Delta t$. On the other hand, in the exponentially decaying waveform shown in FIG. 1*b*, the change in the amount of charge $\Delta q_d$ that is transferred during the same variation in time $\Delta t$ due to the pulse-width jitter is relatively much lower. However, the resulting improvement in the immunity to pulse-width jitter comes at the expense of adding much higher requirements on the slew rate of loop filter integrators within a delta-sigma analog-to-digital converter (ADC) implementation.

Particularly, a delta-sigma ADC having a SCR DAC in the feedback needs approximately a factor of $T_S/\tau_{DAC}$ times higher slew rate in the corresponding loop filter integrator, where $T_S$ is the sampling period and $\tau_{DAC}$ is the SCR DAC time-constant. This is mainly due to the abrupt transition of a large amount of charge at the beginning of the exponentially-decaying pulse, whose value is proportional to $1/\tau_{DAC}$. The jitter tolerance of the exponentially-decaying pulse is determined by the value of $\tau_{DAC}$, where the pulse-width jitter induced error varies exponentially with $-1/\tau_{DAC}$. Hence, there is a trade-off between the pulse-width jitter tolerance of the DAC exponentially decaying waveform and the slew rate requirement on the loop filter integrators, and this trade-off is controlled by the value of $\tau_{DAC}$.

In order to achieve an adequate tolerance to pulse-width jitter in continuous-time delta-sigma modulators using SCR DAC implementations in the feedback, $\tau_{DAC}$ is typically in the range of 0.05 $T_S$ to 0.1 $T_S$, which results in an increased slew rate requirement on loop filter integrators in the order of ten times compared to delta-sigma modulators using NRZ SI DACs. Thus, it is desirable to provide a clock-jitter tolerant waveform to a DAC having a high immunity to pulse-width jitter (which is equivalent to a SCR DAC) without adding a higher requirement on the slew rate of an operational amplifier.

II. Pulse-Width Jitter Tolerant DAC

Figure 2:
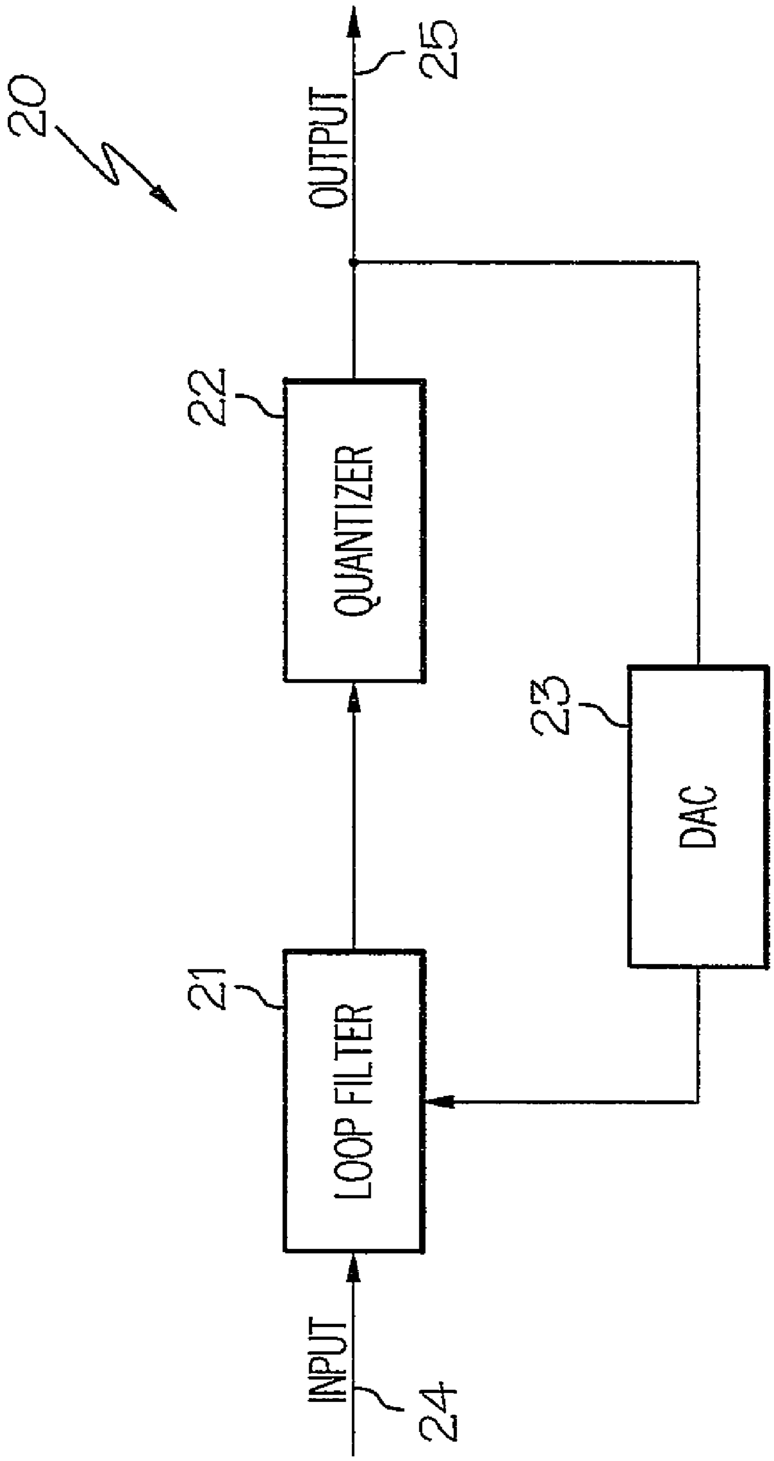
FIG. 2 is a block diagram of a delta-sigma ADC in which a preferred embodiment of the present invention may be incorporated.

With reference now to FIG. 2, there is illustrated a block diagram of a delta-sigma ADC in which a preferred embodiment of the present invention may be incorporated. As shown, a clock-jitter tolerant ADC 20 includes a loop filter circuit 21, a loop quantizer circuit 22 and a pulse-width jitter tolerant DAC 23. ADC 20 also includes an input 24 and an output 25. Pulse-width jitter tolerant DAC 23 provides a feedback loop between loop filter circuit 21 and loop quantizer circuit 22.

Figure 3:
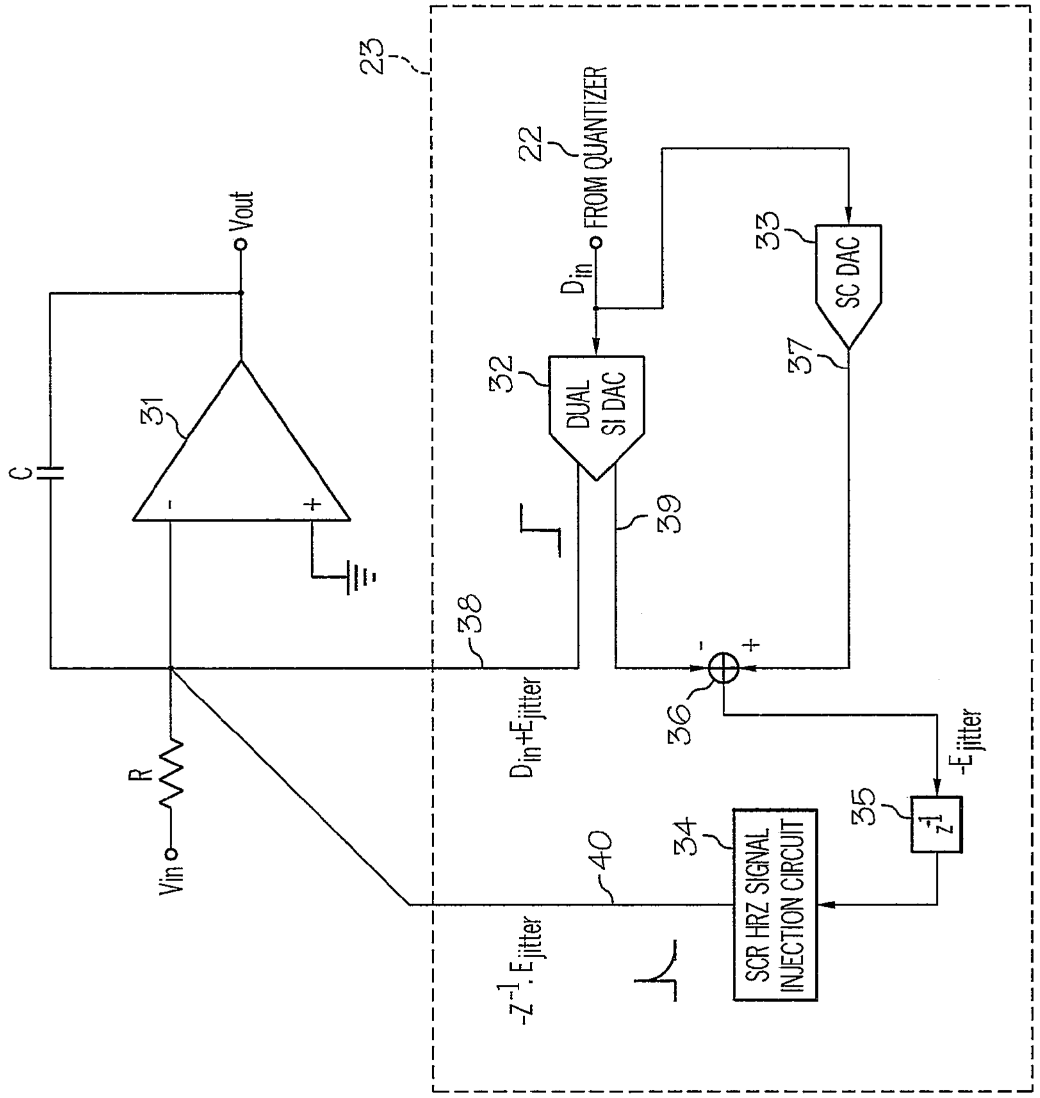
FIG. 3 is a detailed block diagram of a clock-jitter tolerant DAC for the delta-sigma ADC from FIG. 2, in accordance with a preferred embodiment of the present invention.

Referring now to FIG. 3, there is depicted a detailed block diagram of pulse-width jitter tolerant DAC 23, in accordance with a preferred embodiment of the present invention. As shown, pulse-width jitter tolerant DAC 23 includes a dual NRZ SI DAC 32, a RZ SC DAC 33, a HRZ SCR signal injection circuit 34, a one-cycle delay circuit 35 and an adder 36. RZ SC DAC 33 is a voltage sampling circuit that does not suffer from clock-jitter because it samples a signal carrying discrete digital data that is constant over a clock-cycle. Pulse-width jitter tolerant DAC 23 is connected to a first stage of loop filter 21 (from FIG. 2). In FIG. 3, the first stage of loop filter 21 is represented by an active-RC integrator having an operational amplifier 31, a resistor R and a capacitor C. $V_{in}$ is the same input 24 to ADC 20 in FIG. 2.

Pulse-width jitter tolerant DAC 23 is based on spectral shaping for the error induced by pulse-width jitter. Initially, a feedback digital signal $D_{in}$ from quantizer circuit 22 in FIG. 2 is separately applied to dual NRZ SI DAC 32 and RZ SC DAC 33. In turn, dual NRZ SI DAC 32 generates a $D_{in}+E_{jitter}$ signal value at an output 38 and an identical signal value at an output 39. On the other hand, RZ SC DAC 33 generates an error-free reference signal value at an output 37.

Output 38 provides the main feedback path to the first stage of loop filter 21 via operational amplifier 31. The $D_{in}+E_{jitter}$ signal value from output 39 is then subtracted from the error-free reference signal value from output 37 via adder 36 to generate a pulse-width jitter induced error value with a negative polarity (i.e., $-E_{jitter}$).

Next, the inverted pulse-width jitter induced error value $-E_{jitter}$ is fed to one-cycle delay circuit 35 in order to provide a one clock cycle delay on the inverted pulse-width jitter induced error value $-E_{jitter}$. As mentioned above, output 38 of pulse-width jitter tolerant DAC 23 carries the digital data $D_{in}$ and the pulse-width jitter induced error $E_{jitter}$ (i.e., $D_{in}+E_{jitter}$). Output 40 of pulse-width jitter tolerant DAC 23 carries the inverted pulse-width jitter induced error delayed by one clock cycle (i.e., $-Z^{-1}\cdot E_{jitter}$). Thus, a first-order spectral shaping $E_{jitter}(1-Z^{-1})$ for the jitter induced error is achieved at the input of loop filter 21. The pulse-width jitter induced error is high-pass filtered and pushed to higher frequencies to be later removed by a decimation filter in the digital domain. High fidelity in the delayed jitter induced error signal is needed in order to achieve accurate first-order spectral shaping. The delayed jitter error is injected into loop filter 21 in an exponentially-decaying waveform generated by HRZ SCR signal injection circuit 34 to ensure adequate robustness of this particular signal carrying the delayed jitter error to pulse-width jitter, and hence maintain reliable first-order shaping for the pulse-width jitter of SI DAC 32. Also, using exponentially-decaying waveform generated by an SCR circuit avoids the need for an additional SI DAC to inject the delayed jitter error because the SCR circuit is built only using passive elements (i.e., resistors and capacitors), and the capacitor needed for HRZ SCR signal injection circuit 34 can be shared with the capacitor in the voltage sampling circuit of SC DAC 33, such that additional hardware overhead needed for SCR HRZ signal injection circuit 34 will include resistors only.

The key point is to combine the NRZ rectangular waveform from dual SI DAC 32 with the HRZ exponentially-decaying waveform from SCR HRZ signal injection circuit 34 efficiently in order to achieve the required error spectral shaping without adding high requirement on the slew rate of operational amplifiers 31 used in loop filter 21. The overhead in the signal swing added by the delayed exponentially-decaying pulse in output 40 to the main feedback signal coming from DAC output 38 is extremely small because it carries only the pulse-width jitter induced error signal, the dynamic-range of which is much smaller than the main feedback signal at output 38 or the signal that would come from any NRZ SI DAC.

As has been described, the present invention provides an improved continuous-time delta-sigma ADC having a pulse-width jitter tolerant DAC. The hybrid error shaping technique can be implemented with minimized additional hardware (i.e., a simple SC sampling circuit, one additional SI DAC output, and a resistor). Moreover, since there is no extra circuitry added to the signal path, no additional excess-loop delay in the feedback path is introduced.

While the invention has been particularly shown and described with reference to a preferred embodiment, it will be understood by those skilled in the art that various changes in form and detail may be made therein without departing from the spirit and scope of the invention.

What is claimed is:

1. A clock-jitter tolerant digital-to-analog converter (DAC) comprising:

a dual switched-current (SI) DAC for providing a first analog signal and second analog signal from a feedback digital signal of a loop quantizer within a delta-sigma analog-to-digital converter (ADC), wherein said first and second analog signals are substantially identical to each other;

a switched-capacitor (SC) DAC for providing an error-free reference signal from said feedback digital signal;

an adder for generating an inverted jitter induced error signal by subtracting said second analog signal from said error-free reference signal; and an injection circuit for providing a half-delay return-to-zero exponentially-decaying waveform based on a delayed version of said inverted jitter induced error signal.

2. The DAC of claim 1, wherein said DAC further includes one-cycle delay block.

3. The DAC of claim 1, wherein said SI DAC is a non-return-to-zero DAC.

4. The DAC of claim 1, wherein said injection circuit is a switched-capacitor-resistor injection circuit.

5. A continuous-time delta-sigma analog-to-digital converter (ADC) comprising:

a loop filter;

a loop quantizer coupled to said loop filter; and a clock-jitter tolerant digital-to-analog converter (DAC) coupled to said loop filter and said loop quantizer, wherein said clock-jitter tolerant DAC includes a dual switched-current (SI) DAC for providing a first analog signal and second analog signal from a feedback digital signal of a loop quantizer within a delta-sigma analog-to-digital converter (ADC), wherein said first and second analog signals are substantially identical to each other;

a switched-capacitor (SC) DAC for providing an error-free reference signal from said feedback digital signal;

an adder for generating an inverted jitter induced error signal by subtracting said second analog signal from said error-free reference signal; and an injection circuit for providing a half-delay return-to-zero (HRZ) exponentially-decaying waveform based on a delayed version of said inverted jitter induced error signal.

6. The ADC of claim 5, wherein said DAC further includes one-cycle delay block.

7. The ADC of claim 5, wherein said SI DAC is a non-return-to-zero DAC.

8. The ADC of claim 5, wherein said injection circuit is a switched-capacitor-resistor injection circuit.

9. The ADC of claim 5, wherein said injection circuit sends said HRZ exponentially-decaying waveform to said loop filter.

* * * * *